(12) United States Patent
Ping et al.

(10) Patent No.: US 11,805,701 B2
(45) Date of Patent: Oct. 31, 2023

(54) MEMORY AND FORMING METHODS AND CONTROL METHODS THEREOF

(71) Applicant: CHANGXIN MEMORY TECHNOLOGIES, INC., Anhui (CN)

(72) Inventors: Erxuan Ping, Hefei (CN); Xiaoguang Wang, Hefei (CN); Baolei Wu, Hefei (CN); Yulei Wu, Hefei (CN)

(73) Assignee: CHANGXIN MEMORY TECHNOLOGIES, INC., Anhui (CN)

( * ) Notice: Subject to any disclaimer, the term of this patent is extended or adjusted under 35 U.S.C. 154(b) by 277 days.

(21) Appl. No.: 17/310,366

(22) PCT Filed: Nov. 11, 2020

(86) PCT No.: PCT/CN2020/128161
§ 371 (c)(1),
(2) Date: Jul. 29, 2021

(87) PCT Pub. No.: WO2021/253717
PCT Pub. Date: Dec. 23, 2021

(65) Prior Publication Data
US 2022/0320422 A1    Oct. 6, 2022

(30) Foreign Application Priority Data

Jun. 19, 2020  (CN) .......................... 202010564993.0

(51) Int. Cl.
*G11C 11/16*    (2006.01)
*H10N 50/01*    (2023.01)
(Continued)

(52) U.S. Cl.
CPC ........... *H10N 50/01* (2023.02); *G11C 11/161* (2013.01); *G11C 11/1655* (2013.01);
(Continued)

(58) Field of Classification Search
CPC .............. G11C 11/161; G11C 11/1655; G11C 11/1657; G11C 11/1659; G11C 11/1673;
(Continued)

(56) References Cited

U.S. PATENT DOCUMENTS 7,843,718 B2   11/2010  Koh et al.
8,879,314 B2 *  11/2014  Mani ..................... H01L 29/872
                                                        365/158
(Continued)

FOREIGN PATENT DOCUMENTS

CN          105321949 A      2/2016
CN          110323247 A     10/2019
(Continued)

OTHER PUBLICATIONS

Extended European Search Report in Application No. 20925004.2, dated May 31, 2022.
(Continued)

*Primary Examiner* — Khamdan N. Alrobaie
(74) *Attorney, Agent, or Firm* — SYNCODA LLC; Feng Ma (57) ABSTRACT

A memory includes: a substrate, having a plurality of active regions arranged in an array and a plurality of word lines extending in a first direction, the active regions being inclined at a preset angle to the word lines, the active region having at least one access transistor; a plurality of bit lines, extending in a second direction perpendicular to the first direction; magnetic tunnel junctions, one end of the magnetic tunnel junction is electrically connected to one of bit lines and another end of the magnetic tunnel junction is electrically connected to two access transistors, the two access transistors electrically connected to the magnetic tunnel junction being located in two adjacent active regions, respectively.

20 Claims, 5 Drawing Sheets

(51) Int. Cl.
*H10B 61/00* (2023.01)
*H10N 50/10* (2023.01)
*H10N 50/80* (2023.01)

(52) U.S. Cl.
CPC ...... *G11C 11/1657* (2013.01); *G11C 11/1659* (2013.01); *G11C 11/1673* (2013.01); *G11C 11/1675* (2013.01); *H10B 61/22* (2023.02); *H10N 50/10* (2023.02); *H10N 50/80* (2023.02)

(58) Field of Classification Search
CPC ..... G11C 11/1675; G11C 11/02; H10B 61/22; H10N 50/10; H10N 50/80; H10N 50/01
See application file for complete search history.

(56) References Cited

U.S. PATENT DOCUMENTS

| | | | |
|---|---|---|---|
| 10,008,537 B2* | 6/2018 | Li | ............ H10N 59/00 |
| 10,332,890 B2 | 6/2019 | Lee et al. | |
| 2011/0215382 A1* | 9/2011 | Asao | ............ G11C 11/1659 |
| | | | 257/E29.323 |
| 2011/0254112 A1* | 10/2011 | Yamanaka | ............ H10B 61/22 |
| | | | 257/E29.323 |
| 2012/0099363 A1 | 4/2012 | Inaba | |
| 2014/0063891 A1* | 3/2014 | Asao | ............ G11C 11/1655 |
| | | | 365/66 |
| 2014/0117477 A1 | 5/2014 | Park et al. | |
| 2014/0306277 A1 | 10/2014 | Asao | |
| 2015/0043272 A1 | 2/2015 | Zhou et al. | |
| 2015/0070982 A1* | 3/2015 | Miyakawa | ............ G11C 11/161 |
| | | | 365/158 |
| 2016/0225429 A1* | 8/2016 | Toh | ............ G11C 11/1659 |
| 2022/0190028 A1* | 6/2022 | Ping | ............ G11C 11/1657 |
| 2023/0026502 A1* | 1/2023 | Wang | ............ H10B 12/50 |

FOREIGN PATENT DOCUMENTS

| | | |
|---|---|---|
| CN | 212136451 U | 12/2020 |
| WO | 2019005129 A1 | 1/2019 |

OTHER PUBLICATIONS

International Search Report in Application No. PCT/CN2020/128161, dated Mar. 30, 2021.

* cited by examiner

MEMORY AND FORMING METHODS AND CONTROL METHODS THEREOF

CROSS-REFERENCE TO RELATED APPLICATIONS

This application is a national stage of International Application No. PCT/CN2020/128161 filed on Nov. 11, 2020, which claims priority to Chinese Patent Application No. 202010564993.0, filed on Jun. 19, 2020. The disclosures of these applications are hereby incorporated by reference in their entirety.

TECHNICAL FIELD

The present disclosure relates to the technical field of semiconductor manufacturing, in particular to a memory and a forming method and control method thereof.

BACKGROUND OF THE PRESENT INVENTION

Magnetic random access memories (MARMs), as non-volatile memories based on the integration of silicon-based complementary oxide semiconductors (CMOSs) and magnetic tunnel junctions (MTJs), have the high-speed reading and writing capability of static random access memories and high integration of dynamic random access memories. The magnetic tunnel junction generally comprises a fixed layer, a tunneling layer, and a free layer. When a magnetic random access memory is working normally, the magnetization direction of the free layer can be changed, while the magnetization direction of the fixed layer remains unchanged. The resistance of the magnetic random access memory is related to the relative magnetization directions of the free layer and the fixed layer. When the magnetization direction of the free layer changes relative to the magnetization direction of the fixed layer, the resistance of the magnetic random access memory changes correspondingly, corresponding to different storage information.

However, in the existing magnetic random access memories, due to the limitation of the arrangements of the storage units and the connection modes of the magnetic tunnel junctions with the transistors, the further improvement of the overall performance of the magnetic random access memories is restricted, and the wide application of the magnetic random access memories is thus limited.

Therefore, how to improve the structure of the memories and improve the overall performance of the memories is a technical problem to be solved urgently.

SUMMARY OF THE PRESENT INVENTION

The present disclosure provides a memory and a forming method and a control method thereof, to further improve the overall performance of the existing memories.

In order to solve the problem mentioned above, the present disclosure provides a memory, comprising:

a substrate, having a plurality of active regions arranged in an array and a plurality of word lines extending in a first direction, the active regions being inclined at a preset angle to the word lines, the active region having at least one access transistor;

a plurality of bit lines, extending in a second direction perpendicular to the first direction; and magnetic tunnel junctions, one end of the magnetic tunnel junction is electrically connected to one of bit lines and another end of the magnetic tunnel junction is electrically connected to two access transistors, the two access transistors electrically connected to the magnetic tunnel junction being located in two adjacent active regions, respectively.

Optionally, the memory further comprises:

conductive contact pads, located above the substrate, one end of the conductive contact pad is electrically connected to the magnetic tunnel junction and another end of the conductive contact pad is electrically connected to sources of the two access transistors at the same time.

Optionally, the two access transistors electrically connected to the magnetic tunnel junction are located in two active regions, respectively, the two active regions are arranged in the second direction and adjacent to each other; or the two access transistors electrically connected to the magnetic tunnel junction are located in two active regions, respectively, the two active regions are arranged in a third direction and adjacent to each other, the third direction being inclined at the preset angle to the first direction.

Optionally, each of the active regions has two access transistors located at two opposite ends of the active region; and two access transistors electrically connected to the magnetic tunnel junction are located at ends, which are close to each other, of two adjacent active regions, respectively.

Optionally, each of the active regions overlaps two adjacent word lines; and two access transistors located in a same active region correspond to the two word lines, respectively.

Optionally, the memory further comprises:

source lines, extending in the first direction, one of the active regions overlapping one of the source lines; and drains of two access transistors located in a same active region are electrically connected to a same source line.

Optionally, the source lines are curved, and the source lines are electrically connected to the access transistors in the active regions at corners.

Optionally, the preset angle is greater than 30° and less than 90°.

In order to solve the problem mentioned above, the present disclosure further provides a method for forming a memory, comprising:

forming a substrate, the substrate having a plurality of active regions arranged in an array and a plurality of word lines extending in a first direction, the active regions being inclined at a preset angle to the word lines, the active region having at least one access transistor;

forming magnetic tunnel junctions on the substrate, one end of the magnetic tunnel junction being electrically connected to two access transistors, the two access transistors electrically connected to the magnetic tunnel junction being located in two adjacent active regions, respectively; and forming a plurality of bit lines extending in a second direction, another end of the magnetic tunnel junction being electrically connected to one of the bit lines, and the second direction being perpendicular to the first direction.

Optionally, the forming magnetic tunnel junctions on the substrate comprises:

forming conductive contact pads above the substrate, the conductive contact pads being electrically connected to sources of two access transistors at the same time; and forming magnetic tunnel junctions above the conductive contact pads, the magnetic tunnel junctions being electrically connected to the conductive contact pads.

Optionally, the two access transistors electrically connected to the magnetic tunnel junction are located in two active regions, respectively, the two active regions are arranged in the second direction and adjacent to each other; or the two access transistors electrically connected to the magnetic tunnel junction are located in two active regions, respectively, the two active regions are arranged in a third direction and adjacent to each other, the third direction being inclined at the preset angle to the first direction.

Optionally, the forming a substrate comprises:
providing a semiconductor substrate;
forming, on the semiconductor substrate, a plurality of active regions arranged in an array, a plurality of word lines extending in a first direction and two access transistors located in each of the active regions, the active regions being inclined at the preset angle to the word lines, and the two access transistors being located at opposite ends of the active region.

Optionally, each of the active regions overlaps two adjacent word lines; and
two access transistors located in a same active region correspond to the two word lines, respectively.

Optionally, the method further comprises:
forming, on the substrate, source lines extending in the first direction, one of the active regions overlapping one of the source lines, drains of two access transistors located in a same active region being electrically connected to a same source line.

Optionally, the source lines are curved, and the source lines are electrically connected to the access transistors in the active regions at corners.

Optionally, the preset angle is greater than 30° and less than 90°.

In order to solve the problem mentioned above, the present disclosure further provides a method for controlling a memory, the memory comprising a plurality of source lines extending in the first direction, comprising:

selecting target magnetic tunnel junctions, one end of the magnetic tunnel junction is electrically connected to one target bit line and another end of the magnetic tunnel junction is electrically connected to sources of two target access transistors, drains of the two target access transistors being electrically connected to two target source lines, respectively, gates of the two target access transistors being electrically connected to two target word lines, respectively; and transmitting a high level to the target bit line and a low level to the bit lines other than the target bit line at the same time, transmitting a high level to the target word lines and a low level to the word lines other than the target word lines at the same time, and transmitting a low level to all the source lines, to perform a first writing operation.

Optionally, the method further comprises:
transmitting a low level to all the bit lines, transmitting a high level to the two target word lines and a low level to the word lines other than the target word lines at the same time, transmitting a high level to the target source lines and a low level to the source lines other than the target source lines, to perform a second writing operation.

Optionally, the method further comprises:
transmitting a high level to the target bit line and a low level to the bit lines other than the target bit line at the same time, transmitting a high level to the target word lines and a low level to the word lines other than the target word lines at the same time, and transmitting a low level to all the source lines, to perform a reading operation.

Optionally, the method further comprises:

transmitting a low level to all the bit lines, a low level to all the word lines and a low level to all the source lines, to perform an standby operation.

For the memory and the forming method and control method thereof according to the present disclosure, by inclining the active regions at a preset angle to the extension direction of the word lines and connecting the access transistors in two adjacent active regions by one magnetic tunnel junction, large driving current required by the programming of memories is ensured, and also, the storage density of the storage units is increased, the comprehensive performance of memories is improved, and the product competitiveness of magnetic memories is thus enhanced.

DETAILED DESCRIPTION OF THE PRESENT INVENTION

The specific embodiment of the memory and a forming method and control method thereof according to the present disclosure will be described in detail below with reference to the accompanying drawings.

Figure 1:
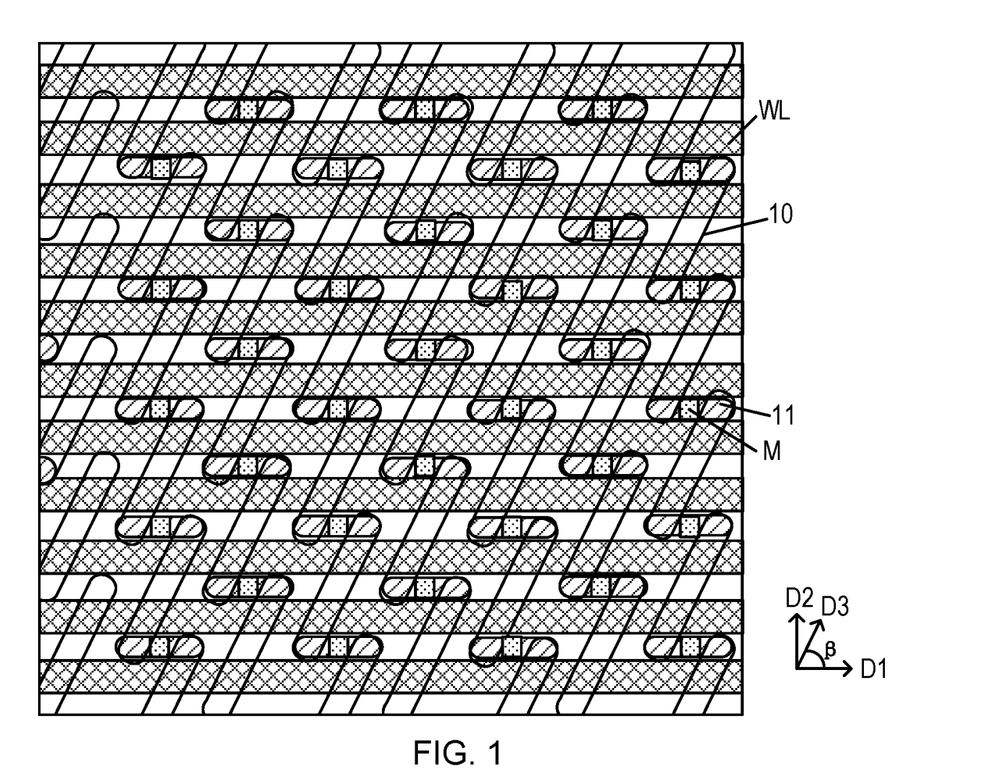
FIG. 1 is a schematic structure diagram of a memory in a specific embodiment of the present disclosure.
Figure 2:
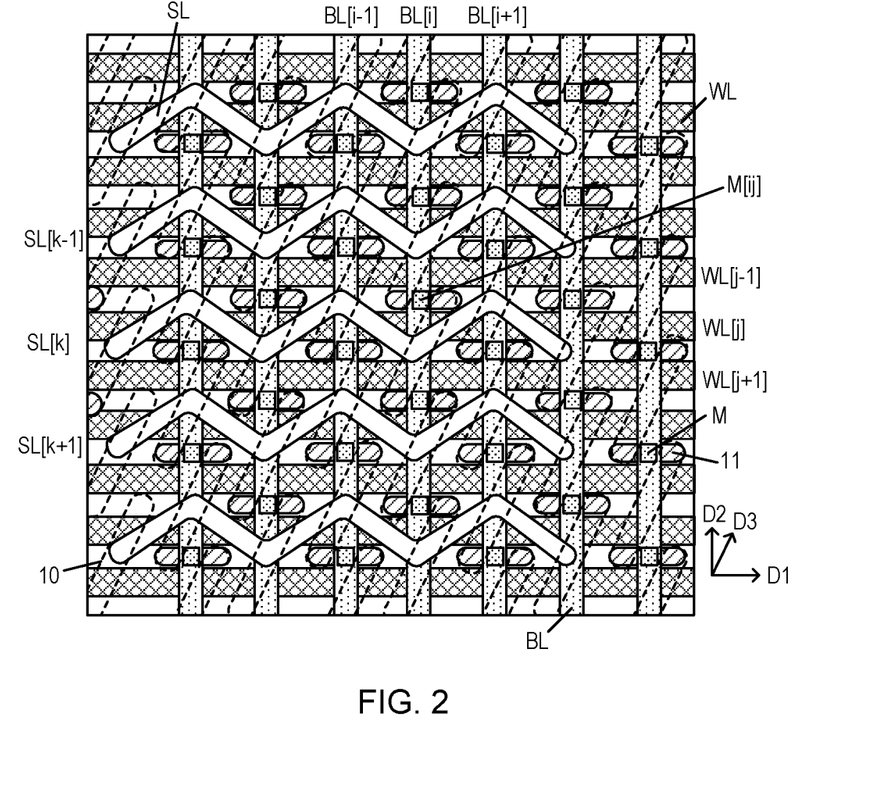
FIG. 2 is a schematic structure diagram of a memory comprising bit lines and source lines in a specific embodiment of the present disclosure.

This specific embodiment provides a memory. FIG. 1 is a schematic structure diagram of a memory in a specific embodiment of the present disclosure; and FIG. 2 is a schematic structure diagram of a memory comprising bit lines and source lines in a specific embodiment of the present disclosure. As shown in FIG. 1 and FIG. 2, the memory in this specific embodiment comprises:

a substrate, having a plurality of active regions 10 arranged in an array and a plurality of word lines WL extending in a first direction D1, the active regions 10 being inclined at a preset angle to the word lines WL, the active region 10 having at least one access transistor;

a plurality of bit lines BL, extending in a second direction D2 perpendicular to the first direction D1; and magnetic tunnel junctions M, one end of each of the magnetic tunnel junctions M is electrically connected to one of the bit lines BL and another end of each of the magnetic tunnel junctions M is electrically connected to two of the access transistors, the two of the access transistors electrically connected to one of the magnetic tunnel junctions M being located in two adjacent active regions 10, respectively.

In FIG. 2, in order to clearly show the relationships among the active regions 10, the word lines WL and the bit lines BL, the active regions 10 are indicated by a dotted line. Specifically, the substrate may be, but is not limited to, a silicon substrate. The plurality of active regions 10 are arranged in an array inside the substrate, for example, but not limited to, in a staggered arrangement, so as to increase the arrangement density of the active regions 10. In this specific embodiment, each of the active regions 10 extends in a third direction D3, each of the word lines WL extends in the first direction D1, and an angle β between the first direction D1 and the third direction D1 is a preset angle. The preset angle is a non-right angle. Optionally, the preset angle is greater than 30° and less than 90°, for example, 45°-75°, 50°-70°, or 65°-70°. In this specific embodiment, the preset angle is 68.95°. The bit lines BL are arranged above the magnetic tunnel junctions M, and the bit lines BL extend in a second direction D2 perpendicular to the first direction D1. One end of each of the magnetic tunnel junctions M is electrically connected to one of the bit lines BL, and another end thereof is electrically connected to two access transistors located in two adjacent active regions 10 (not shown). The specific electrical connection between the magnetic tunnel junctions M and the access transistors may be direct-contact electrical connection, or indirect electrical connection through other electrical elements (such as plugs), which may be determined by those skilled in the art according to actual demands. Specifically, the access transistors may be transistors of any structure, for example, buried-gate transistors, gate-all-around field effect transistors or planar transistors. The use of buried-gate transistors can reduce the area occupied by the transistors while ensuring sufficient channel length, thereby increasing the storage density.

Figure 4:
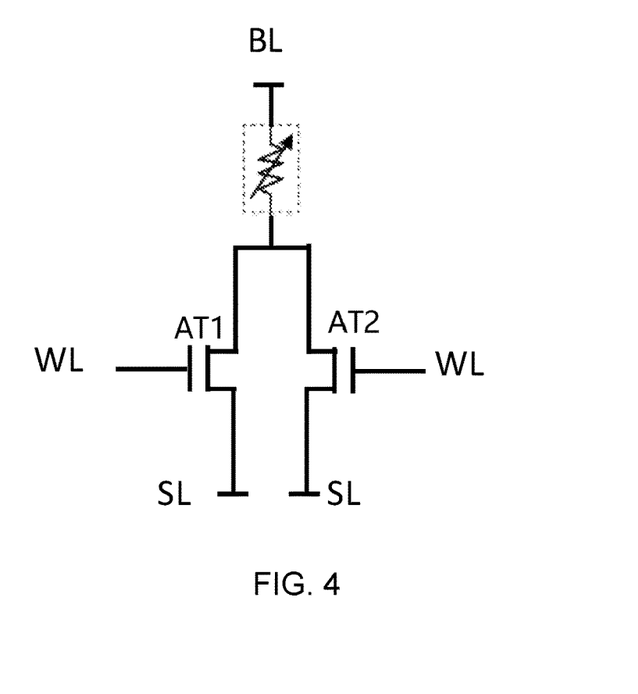
FIG. 4 is an equivalent circuit diagram of access transistors being electrically connected to magnetic tunnel junctions in a specific embodiment of the present disclosure.

FIG. 4 is an equivalent circuit diagram of access transistors being electrically connected to magnetic tunnel junctions in a specific embodiment of the present disclosure. AT1 represents one access transistor located in one of the active regions 10, and AT2 represents another access transistor located in an adjacent active region. This specific embodiment provides a layout of electrical elements in a new memory. Specifically, by inclining the active regions 10 at a preset angle to the extension direction of the word lines WL and by limiting the location of the magnetic tunnel junctions M, one of the magnetic tunnel junctions M is electrically connected to the access transistors located in two adjacent active regions. Thus, driving current required during the programming of the magnetic tunnel junctions M is ensured, and also, the storage density is increased and the overall performance of memories is improved.

Optionally, the memory further comprises:

conductive contact pads 11, located on the substrate, one end of each of the conductive contact pads 11 is electrically connected to the magnetic tunnel junctions M and another end of each of the conductive contact pads 11 is electrically connected to sources of the two access transistors.

For example, projections of the conductive contact pads 11 in a direction perpendicular to the substrate may extend from one of the active regions 10 to another active region 10 adjacent to the one active region 10, so that the bottom end of one of the conductive contact pads 11 is electrically connected to the sources of the two access transistors in two adjacent active regions 10, and the top end of one of the conductive contact pads 11 is electrically connected to one of the magnetic tunnel junctions M. The arrangement of the conductive contact pads 11 is helpful to increase the electrical connection area between the access transistors and the magnetic tunnel junctions M, thereby ensuring the stability of the electrical connection between the magnetic tunnel junctions M and the access transistors.

Optionally, the two access transistors electrically connected to one of the magnetic tunnel junctions M are located in two active regions 10, respectively, which are arranged along the second direction D2 and adjacent to each other, as shown in FIG. 1 and FIG. 2.

Specifically, as shown in FIG. 1 and FIG. 2, a plurality of the active regions 10 are arranged in parallel along the second direction D2, and one magnetic tunnel junctions M is arranged between two adjacent active regions 10 arranged in parallel along the second direction D2. In a direction perpendicular to the substrate, one conductive contact pads 11, extending in the first direction D1, is arranged between the magnetic tunnel junctions M and the active regions 10, and the projection of the conductive contact pad 11 in a direction perpendicular to the substrate extends from one active region 10 to another active region 10 adjacent thereto. By the conductive contact pads 11, two access transistors are electrically connected to one magnetic tunnel junctions M, to form a 2T1MTJ (Two-transistor-one-MTJ) structure, two access transistors are located in two adjacent active regions 10 which are arranged along the second direction D2 and adjacent to each other. In such an arrangement, in order to realize the electrical connection between the bit lines BL and the magnetic tunnel junctions M, the projection of one of the bit lines BL in the direction perpendicular to the substrate overlaps all of the magnetic tunnel junctions arranged in parallel along the second direction D2 and electrically connected to this bit line BL. This arrangement shown in FIG. 1 and FIG.2 can reduce the overlapping of the conductive contact pads 11 with the word lines WL and bit lines BL, reduce the parasitic capacitance, and improve the performance. It should be noted that, due to the different size of the active regions, the extension direction of the conductive contact pads 11 may deviate from the first direction D1, which may be set by those skilled in the art according to actual demands.

Figure 3:
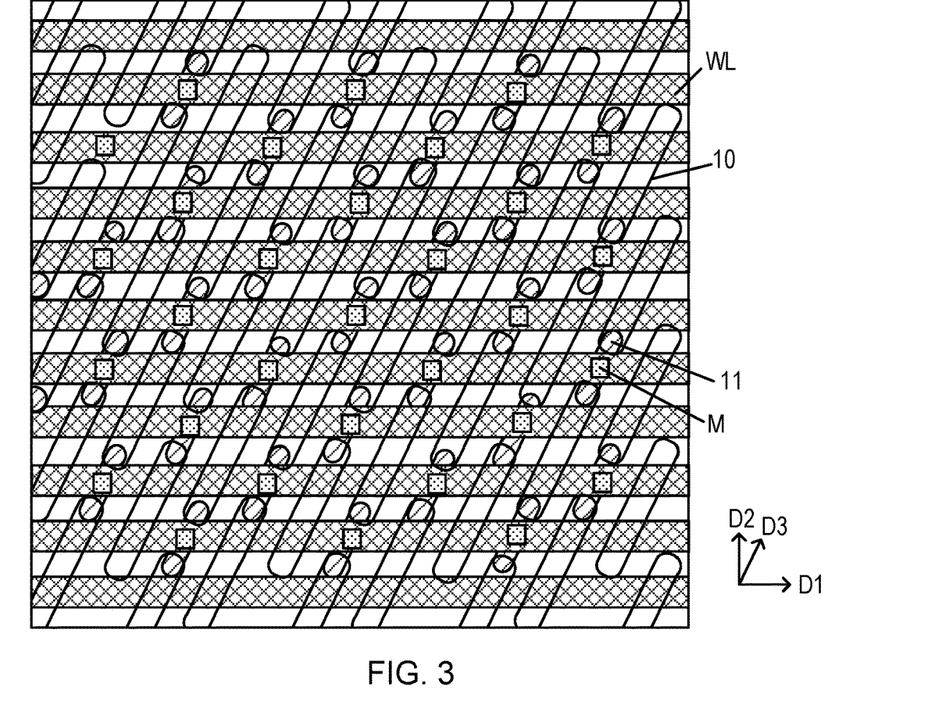
FIG. 3 is another schematic structure diagram of a memory in a specific embodiment of the present disclosure.

FIG. 3 is another schematic structure diagram of a memory in a specific embodiment of the present disclosure. It may be determined by those skilled in the art according to actual demands so that two access transistors electrically connected to one magnetic tunnel junctions M are located in two active regions 10 arranged along the third direction D3 and adjacent to each other. The third direction D3 is inclined at the preset angle β to the first direction D1, as shown in FIG. 3.

Specifically, as shown in FIG. 3, in the third direction D3 that is inclined at the preset angle to the first direction D1, a plurality of active regions 10 are arranged in parallel, and one magnetic tunnel junctions M is arranged between two adjacent active regions 10 arranged in parallel along the third direction D3. In a direction perpendicular to the substrate, one conductive contact pads 11, extending in the third direction D3, is arranged between the magnetic tunnel junctions M and the active regions 10, and the projection of the conductive contact pad 11 in the direction perpendicular to the substrate extends from one active region 10 to another active region 10 adjacent thereto. By the conductive contact pads 11, two access transistors are electrically connected to one magnetic tunnel junctions M, to also form a 2T1MTJ structure, two access transistors are located in two adjacent active regions 10 which are arranged along the third direction D3 and adjacent to each other. In such an arrangement, in order to realize the electrical connection between the bit lines BL and the magnetic tunnel junctions M, it is necessary to accordingly adjust the location of the bit lines BL, so that the projection of one bit lines BL in the direction perpendicular to the substrate overlaps all of the magnetic tunnel junctions arranged in parallel along the second direction D2 and electrically connected to this bit line BL.

Optionally, each of the active regions 10 has two access transistors located at two opposite ends of the active region 10; and two access transistors electrically connected to one magnetic tunnel junctions M are respectively located at two ends, which are close to each other, of two adjacent active regions 10.

Specifically, one of the active regions 10 has two access transistors located at two opposite ends of the active region 10 in the third direction D3. The projection of one magnetic tunnel junctions M in the direction perpendicular to the substrate is located between two adjacent active regions, so that two access transistors electrically connected to one magnetic tunnel junctions M are located at ends, which are close to each other, of two adjacent active regions 10, to simplify the circuit structure of the memory.

Optionally, one active regions 10 overlaps two adjacent the word lines WL; and two access transistors located in a same active region 10 correspond to two word lines WL, respectively.

Specifically, two adjacent word lines WL pass through a same active region 10, and a portion of one of the word lines WL serves as the gate of one of the access transistors in the active regions 10, and a portion of another word line WL serves as the gate of another access transistor in the active regions 10, so that the two access transistors located in a same active regions 10 can be controlled by two word lines WL, respectively.

Optionally, the memory further comprises:

source lines SL, extending in the first direction D1, one of the active regions 10 overlapping one of the source lines SL; and drains of two access transistors located in a same active regions 10 are both electrically connected to a same source lines SL.

Optionally, the source lines SL are curved, and the source lines SL are electrically connected to the access transistors in the active regions 10 at corners.

FIG. 2 exemplarily shows only some of the source lines SL. In an actual memory product, the drains of all the access transistors inside the substrate should be connected to the corresponding source lines SL. In order to simplify the circuit structure of the memory, in this specific embodiment, the source lines SL are set in a curved shape, for example in a broken line shape or a wavy line shape, and the source lines SL are electrically connected to the drains of two access transistors at the corner, the source lines SL and the two access transistors are in the same active regions 10. For example, two access transistors are electrically connected to a same source lines SL by sharing the drains.

In this specific embodiment, an electrode of an access transistor, which is electrically connected to the magnetic tunnel junctions M through the conductive contact pads 11, is referred to as the source, and an electrode of the access transistor, which is electrically connected to the source lines SL, is referred to as the drain. This is just for the convenience of distinguishing the two electrodes of the access transistor, so as to more clearly describe the structure of the memory according to this specific embodiment. The protection scope is not limited accordingly. It may be determined by those skilled in the art according to actual demands that an electrode of an access transistor, which is electrically connected to the magnetic tunnel junctions M through the conductive contact pads 11, is referred to as the drain, and an electrode of the access transistor, which is electrically connected to the source lines SL, is referred to as the source.

Figure 5:
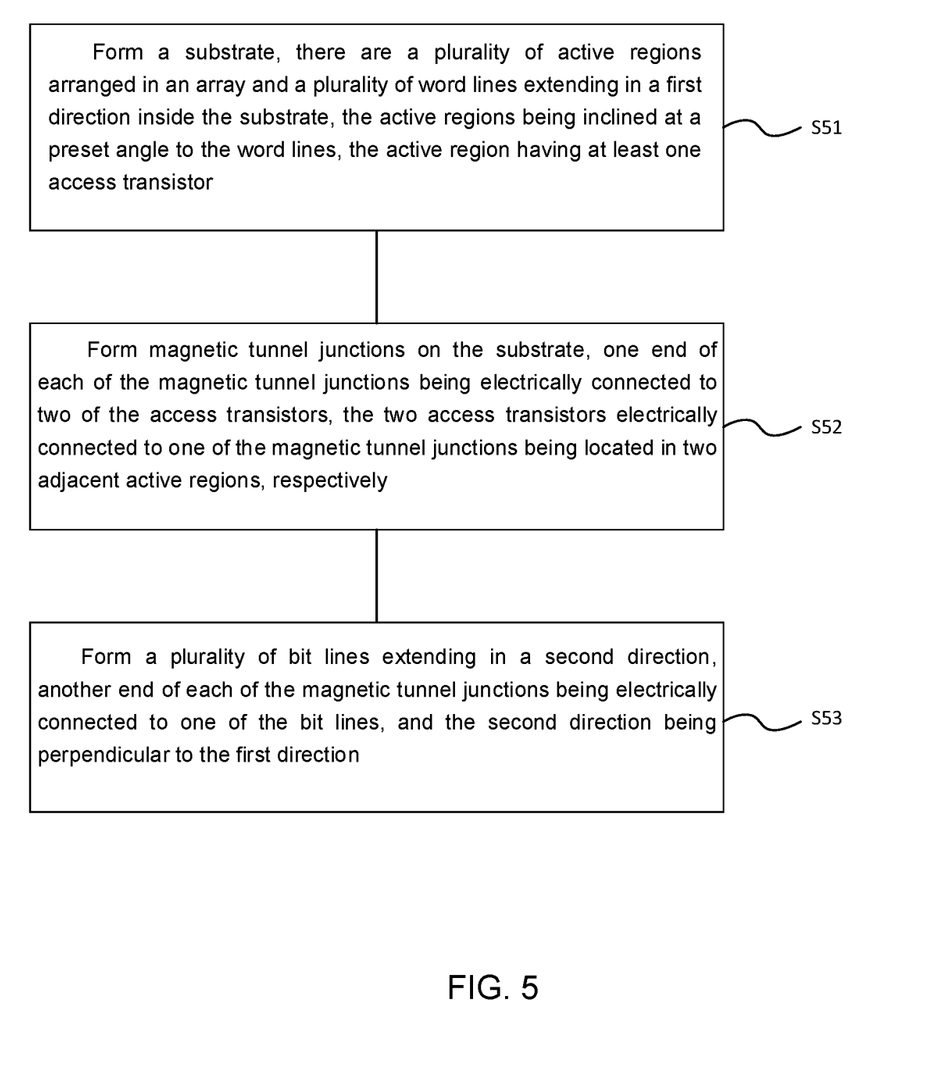
FIG. 5 is a flowchart of a method for forming a memory in a specific embodiment of the present disclosure.

Moreover, this specific embodiment also provides a method for forming a memory. FIG. 5 is a flowchart of a method for forming a memory in a specific embodiment of the present disclosure. The structure of the memory formed in this specific embodiment may see FIG. 1 to FIG. 4. As shown in FIG. 1 to FIG. 5, the method for forming a memory according to this specific embodiment comprises the following steps:

S51: forming a substrate, there are a plurality of active regions 10 arranged in an array and a plurality of word lines WL extending in a first direction D1 inside the substrate, the active regions 10 being inclined at a preset angle β to the word lines WL, the active region 10 having at least one access transistor;

S52: forming magnetic tunnel junctions M on the substrate, one end of each of the magnetic tunnel junctions M being electrically connected to two of the access transistors, the two access transistors electrically connected to one of the magnetic tunnel junctions M being located in two adjacent active regions 10, respectively; and S53: forming a plurality of bit lines BL extending in a second direction D2, another end of each of the magnetic tunnel junctions M being electrically connected to one of the bit lines BL, and the second direction D2 being perpendicular to the first direction D1.

Optionally, the specific step of forming magnetic tunnel junctions M on the substrate comprises:

forming conductive contact pads 11 above the substrate, the conductive contact pads 11 being electrically connected to sources of two access transistors; and forming magnetic tunnel junctions M above the conductive contact pads 11, the magnetic tunnel junctions M being electrically connected to the conductive contact pads 11.

Optionally, two access transistors electrically connected to one magnetic tunnel junctions M are located in two active regions 10, respectively, which are arranged in the second direction D2 and adjacent to each other; or two access transistors electrically connected to one magnetic tunnel junctions M are located in two active regions 10, respectively, which are arranged in a third direction D3 and adjacent to each other, the third direction D3 being inclined at the preset angle β to the first direction D1.

Optionally, the specific step of forming a substrate comprises:

providing a semiconductor substrate;

forming, on the semiconductor substrate, a plurality of active regions 10 arranged in an array, a plurality of word lines WL extending in a first direction D1 and two access transistors located in each of the active regions 10, the active regions 10 being inclined at a preset angle β to the word lines WL, and the two access transistors being located at opposite ends of the active region 10.

Optionally, one active regions 10 overlaps two adjacent word lines WL; and two access transistors located in a same active region 10 correspond to two word lines WL, respectively.

Optionally, the method for forming a memory further comprises the following steps:

forming, on the substrate, source lines SL extending in the first direction D1, one of the active regions 10 overlapping one of the source lines SL, drains of two access transistors located in a same active regions 10 being electrically connected to a same source lines SL.

Optionally, the source lines SL are curved, and the source lines SL are electrically connected to the access transistors in the active regions 10 at corners.

Optionally, the preset angle is greater than 30° and less than 90°.

Figure 6:
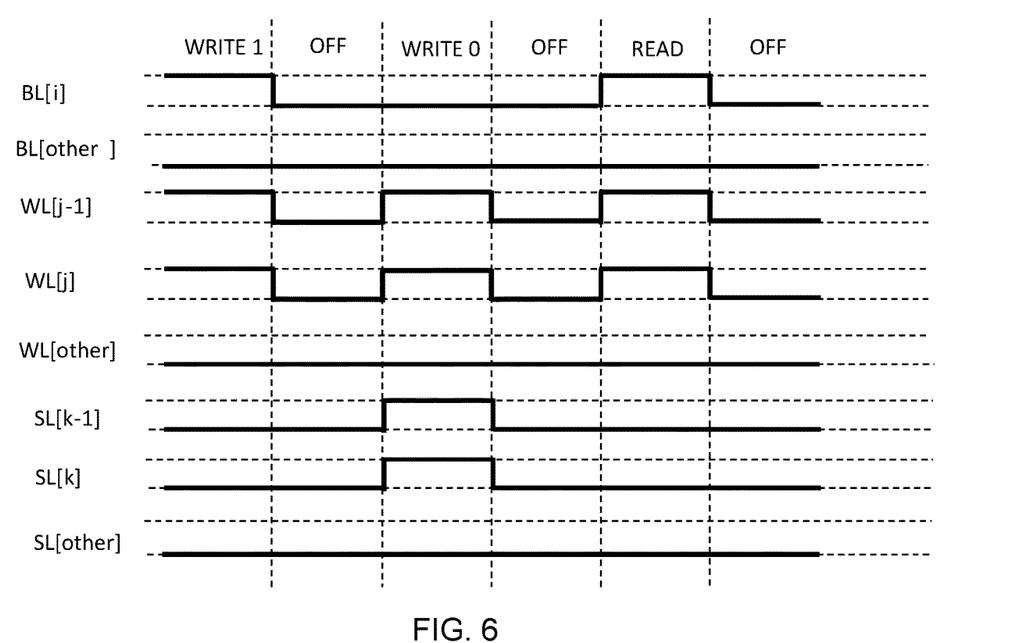
FIG. 6 is a schematic control diagram when writing, reading and standby operations are performed on the memory in a specific embodiment of the present disclosure.

Moreover, this specific embodiment also provides a method for controlling a memory. FIG. 6 is a schematic control diagram when writing, reading and standby operations are performed on the memory in a specific embodiment of the present disclosure. The structure of the memory in this specific embodiment may see FIG. 2. As shown in FIG. 2 and FIG. 6, the memory comprises a plurality of source lines SL extending in the first direction D1; the method for controlling a memory comprises the following steps:

selecting a target magnetic tunnel junction, one end of the target magnetic tunnel junction is electrically connected to one target bit line and another end of the target magnetic tunnel junction is electrically connected to sources of two target access transistors, drains of the two target access transistors being connected to two target source lines, respectively, gates of the two target access transistors being electrically connected to two target word lines, respectively; and transmitting a high level to the target bit line and a low level to the bit lines other than the target bit line at the same time, transmitting a high level to the target word lines and a low level to the word lines other than the target word lines at the same time, and transmitting a low level to all the source lines, to perform a first writing operation.

Optionally, the method for controlling a memory further comprises the following steps:

transmitting a low level to all the bit lines, transmitting a high level to the two target word lines and a low level to the word lines other than the target word lines at the same time, transmitting a high level to the target source lines and a low level to the source lines other than the target source lines, to perform a second writing operation.

Optionally, the method for controlling a memory further comprises following steps:

transmitting a high level to the target bit line and a low level to the bit lines other than the target bit line, transmitting a high level to the target word lines and a low level to the word lines other than the target word lines at the same time, and transmitting a low level to all the source lines, to perform a reading operation.

Optionally, the method for controlling a memory further comprises following steps:

transmitting a low level to all the bit lines, a low level to all the word lines and a low level to all the source lines, to perform an standby operation.

The following description will be given by taking, as an example, the magnetic tunnel junctions M[ij] shown in FIG. 2 as the target magnetic tunnel junction. During the first writing operation, that is, the WRITE 1 operation, a high level (for example, a bit line boosting voltage) is transmitted to the target bit line BL[i] and a low level lower than the high level (for example, a grounding voltage) is transmitted to the bit lines BL[other] other than the target bit line BL[i], for example, BL[i−1], BL[i+1], etc.; a high level (for example, a word line boosting voltage) is transmitted to the target word lines WL[j−1] and WL[j] and meanwhile a low level lower than the high level (for example, a grounding voltage or a negative voltage lower than the grounding voltage) is transmitted to the word lines WL[other] other than the target word lines WL[j−1] and WL[j], for example, WL[j+1], etc.; and a low level (for example, a grounding voltage) is transmitted to all the source lines SL, for example, SL[k−1], SL[k], SL[k+1], etc. Wherein, i, j and k are all positive integers greater than 1.

During the second writing operation, that is, the WRITE 0 operation, a low level (for example, a grounding voltage) is transmitted to all the bit lines, including BL[i] and BL[other]; a high level (for example, a word line boosting voltage) is transmitted to two target word lines WL[j−1] and WL[j] and meanwhile a low level (for example, a grounding voltage or a negative voltage lower than the grounding voltage) is transmitted to the word lines WL[other] other than the target word lines WL[j−1] and WL[j], for example, WL[j+1], etc.; and a high level (for example, a source line boosting voltage) is transmitted to the target source lines SL[k−1] and SL[k] and a low level lower than the high level (for example, a grounding voltage) is transmitted to the source lines SL[other] other than the target source lines SL[k−1] and SL[k], for example, SL[k+1], etc.

During the reading operation, a high level (for example, a bit line boosting voltage) is transmitted to the target bit line BL[i] and meanwhile a low level (for example, a grounding voltage) is transmitted to the bit lines BL[other] other than the target bit line, for example, BL[i−1], BL[i+1], etc.; a high level (for example, a word line boosting voltage) is transmitted to the target word lines WL[j−1] and WL[j] and a low level (for example, a grounding voltage or a negative voltage lower than the grounding voltage) is transmitted to the word lines WL[other] other than the target word lines WL[j−1] and WL[j], for example, WL[j+1], etc.; and a low level (for example, a grounding voltage) is transmitted to all the source lines SL, for example, SL[k−1], SL[k], SL[k+1], etc.

During the standby operation, that is OFF operation, a low level (for example, a grounding voltage) is transmitted to all the bit lines BL, including BL[i] and BL[other]; a low level (for example, a grounding voltage or a negative voltage lower than the grounding voltage) is transmitted to all the word lines WL, including WL[j−1], WL[j] and WL[other]; and a low level (for example, a grounding voltage) is transmitted to all the source lines SL[k−1], SL[k] and SL[other].

It should be noted that the high level and low level mentioned in this specific embodiment are relative concepts (that is, the voltage value of the high level is higher than the voltage value of the corresponding low level). The specific voltage value of the high level is not limited, and the specific voltage value of the low level is also not limited. Moreover, it is not required to ensure that equal high levels are applied to different signal lines in this specific embodiment. For example, the high levels applied to the bit lines and the high level applied to the word lines may be different voltages. Also, it is not required to ensure that equal high levels are applied to specific signal lines at different stages. For example, the high levels applied to the bit lines during the WRITE 1 and reading operations may be different voltages. It may be understood by those skilled in the art that the values of the corresponding high level and low level may be set according to process steps, speed requirements, reliability requirements, etc.

For the memory and the forming method and control method thereof in this specific embodiment, by inclining the active regions at a preset angle to the extension direction of the word lines and connecting the access transistors in two adjacent active regions by a magnetic tunnel junction, large driving current required by the programming of memories is ensured, and also, the storage density of the storage units is increased, the comprehensive performance of memories is improved, and the product competitiveness of magnetic memories is thus enhanced.

The above description is a preferred implementation of the present disclosure, it should be noted that for a person of ordinary skill in the art, various improvements and modifications may be made without departing from the principle of the present disclosure, and those improvements and modifications should also be regarded as falling into the protection scope of the present disclosure.

The invention claimed is:

1. A memory, comprising:
a substrate, having a plurality of active regions arranged in an array and a plurality of word lines extending in a first direction, the active regions being inclined at a preset angle to the word lines, the active region having at least one access transistor;
a plurality of bit lines, extending in a second direction perpendicular to the first direction; and
magnetic tunnel junctions, one end of the magnetic tunnel junction is electrically connected to one of bit lines and another end of the magnetic tunnel junction is electrically connected to two access transistors, the two access transistors electrically connected to the magnetic tunnel junction being located in two adjacent active regions, respectively.

2. The memory according to claim 1, further comprising:
conductive contact pads, located above the substrate, one end of the conductive contact pad is electrically connected to the magnetic tunnel junction and another end of the conductive contact pad is electrically connected to sources of the two access transistors at the same time.

3. The memory according to claim 1, wherein the two access transistors electrically connected to the magnetic tunnel junction are located in two active regions, respectively, the two active regions are arranged in the second direction and adjacent to each other; or
the two access transistors electrically connected to the magnetic tunnel junction are located in two active regions, respectively, the two active regions are arranged in a third direction and adjacent to each other, the third direction being inclined at the preset angle to the first direction.

4. The memory according to claim 3, wherein each of the active regions has two access transistors located at two opposite ends of the active region; and
two access transistors electrically connected to the magnetic tunnel junction are located at ends, which are close to each other, of two adjacent active regions, respectively.

5. The memory according to claim 4, wherein each of the active regions overlaps two adjacent word lines; and
two access transistors located in a same active region correspond to the two word lines, respectively.

6. The memory according to claim 4, further comprising:
source lines, extending in the first direction, one of the active regions overlapping one of the source lines; and
drains of two access transistors located in a same active region are electrically connected to a same source line.

7. The memory according to claim 6, wherein the source lines are curved, and the source lines are electrically connected to the access transistors in the active regions at corners.

8. The memory according to claim 1, wherein the preset angle is greater than 30° and less than 90°.

9. A method for controlling a memory according to claim 1, the memory comprising a plurality of source lines extending in the first direction, comprising:
selecting target magnetic tunnel junctions, one end of the magnetic tunnel junction is electrically connected to one target bit line and another end of the magnetic tunnel junction is electrically connected to sources of two target access transistors, drains of the two target access transistors being electrically connected to two target source lines, respectively, gates of the two target access transistors being electrically connected to two target word lines, respectively; and
transmitting a high level to the target bit line and a low level to the bit lines other than the target bit line at the same time, transmitting a high level to the target word lines and a low level to the word lines other than the target word lines at the same time, and transmitting a low level to all the source lines, to perform a first writing operation.

10. The method for controlling a memory according to claim 9, further comprising:
transmitting a low level to all the bit lines, transmitting a high level to the two target word lines and a low level to the word lines other than the target word lines at the same time, transmitting a high level to the target source lines and a low level to the source lines other than the target source lines, to perform a second writing operation.

11. The method for controlling a memory according to claim 9, further comprising:
transmitting a high level to the target bit line and a low level to the bit lines other than the target bit line at the same time, transmitting a high level to the target word lines and a low level to the word lines other than the target word lines at the same time, and transmitting a low level to all the source lines, to perform a reading operation.

12. The method for controlling a memory according to claim 9, further comprising following steps:
transmitting a low level to all the bit lines, a low level to all the word lines and a low level to all the source lines, to perform a standby operation.

13. A method for forming a memory, comprising:
forming a substrate, the substrate having a plurality of active regions arranged in an array and a plurality of word lines extending in a first direction, the active regions being inclined at a preset angle to the word lines, the active region having at least one access transistor;
forming magnetic tunnel junctions on the substrate, one end of the magnetic tunnel junction being electrically connected to two access transistors, the two access transistors electrically connected to the magnetic tunnel junction being located in two adjacent active regions, respectively; and
forming a plurality of bit lines extending in a second direction, another end of the magnetic tunnel junction being electrically connected to one of the bit lines, and the second direction being perpendicular to the first direction.

14. The method for forming a memory according to claim 13, wherein the forming magnetic tunnel junctions on the substrate comprises:
forming conductive contact pads above the substrate, the conductive contact pads being electrically connected to sources of two access transistors at the same time; and
forming magnetic tunnel junctions above the conductive contact pads, the magnetic tunnel junctions being electrically connected to the conductive contact pads.

15. The method for forming a memory according to claim 13, wherein the two access transistors electrically connected to the magnetic tunnel junction are located in two active regions, respectively, the two active regions are arranged in the second direction and adjacent to each other; or
the two access transistors electrically connected to the magnetic tunnel junction are located in two active regions, respectively, the two active regions are arranged in a third direction and adjacent to each other, the third direction being inclined at the preset angle to the first direction.

16. The method for forming a memory according to claim 15, wherein the forming a substrate comprises:
providing a semiconductor substrate;
forming, on the semiconductor substrate, a plurality of active regions arranged in an array, a plurality of word lines extending in a first direction and two access transistors located in each of the active regions, the active regions being inclined at the preset angle to the word lines, and the two access transistors being located at opposite ends of the active region.

17. The method for forming a memory according to claim 16, wherein each of the active regions overlaps two adjacent word lines; and
two access transistors located in a same active region correspond to the two word lines, respectively.

18. The method for forming a memory according to claim 16, further comprising:
forming, on the substrate, source lines extending in the first direction, one of the active regions overlapping one of the source lines, drains of two access transistors located in a same active region being electrically connected to a same source line.

19. The method for forming a memory according to claim 18, wherein the source lines are curved and the source lines are electrically connected to the access transistors in the active regions at corners.

20. The method for forming a memory according to claim 13, wherein the preset angle is greater than 30° and less than 90°.

* * * * *